Jan. 3, 1967 S. J. SCURO ET AL 3,296,033

SEMICONDUCTOR DEVICE

Filed Oct. 4, 1961

WITNESSES

INVENTORS
Samuel J. Scuro &
Geoffrey W. Wilson
BY

ATTORNEY

United States Patent Office 3,296,033

Patented Jan. 3, 1967

3,296,033

SEMICONDUCTOR DEVICE

Samuel J. Scuro, Verona, Pa., and Geoffrey W. Wilson, Cleethorpes, Lincs, England, assignors to Westinghouse Electric Corporation, Pittsburgh, Pa., a corporation of Pennsylvania Filed Oct. 4, 1961, Ser. No. 142,907

2 Claims. (Cl. 136—205)

The present invention relates to thermoelectric devices utilizing contact alloys at least a portion of which is in the liquid state at the operating temperature of the devices.

One of the major problems in the development of thermoelectric elements is the joining of many components which have highly variable expansion coefficients. The components consist of conductor or contact materials, thermoelectric materials and alloy compositions which are the bonding alloys. As the operating range of these devices is reached, the mismatches in expansion character become more pronounced causing a fracture or break in the circuit to occur after many temperature cycles.

The object of the present invention is to provide thermoelectric devices wherein the bonding alloys employed are at least in part in the liquid state in a given temperature range whereby the stresses produced in the device at the operating temperatures are substantially reduced.

Another object of the invention is to provide a thermoelectric element comprising an outer insulated cylindrical shell having a header member disposed on the upper end thereof, the header member having an electrical conductor passing therethrough, an electrically and thermally conductive member being disposed at the lower end of the cylindrical shell, at least one body of thermoelectric material being disposed within the shell, an alloy solder being disposed between each of the thermoelectric bodies and between the thermoelectric bodies and the conductors so as to provide electrical contact therewith, the alloy solders being of such composition that at the operating temperature of the element the solders are at least in part in the liquid state.

Other objects of the invention will in part, be obvious and will in part, appear hereinafter.

Figure 1:
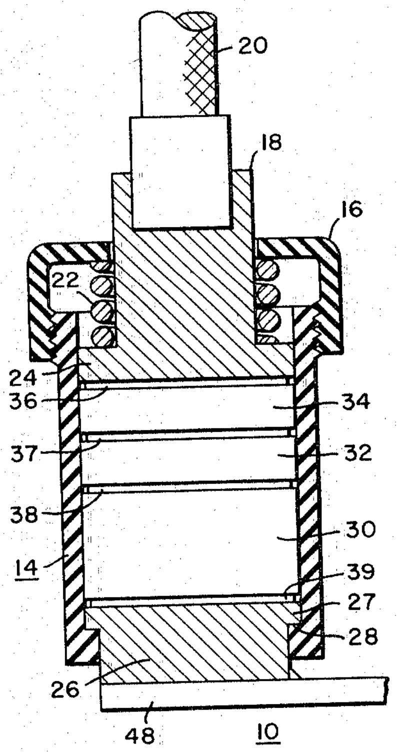
Figure 2:
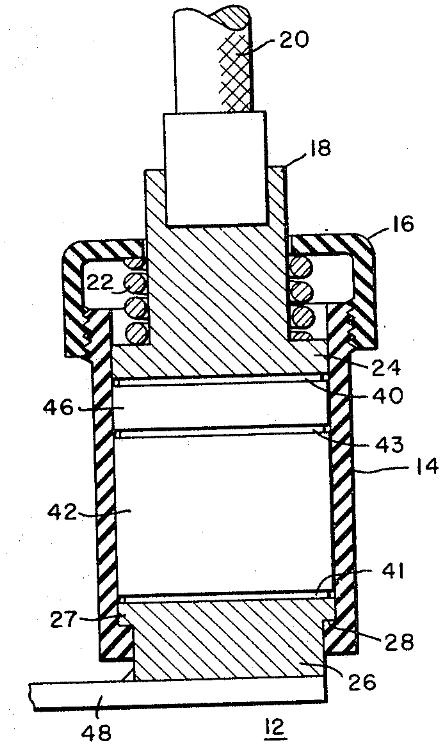

For a better understanding of the nature and objects of the invention reference should be had to the following detailed description and drawings, in which:

FIGURE 1 is a vertical cross section of a thermoelectric element comprising p-type bodies of thermoelectric material; and FIGURE 2 is a vertical cross section of a thermoelectric device comprising n-type bodies of thermoelectric material.

In accordance with the present invention and in attainment of the foregoing objects there is provided a thermoelectric element comprising an outer cylindrical shell within which are disposed thermoelectric members, electrical contacts at each end thereof, solders between the thermoelectric members and the contacts which solders are liquid at least in part, at the operating temperature of the element, and resilient means holding the contacts and thermoelectric member in firm engagement.

In one form, the outer cylindrical shell may be composed of an electrically insulating material, such as an aluminum silicate selling under the trade name Lavite, or the shell may be composed of a non-reactive metal, such as stainless steel. However, in the latter case the inner surfaces of the shell must be coated with a thin sheet of electrically insulating material. An apertured header member is joined to the upper end of the shell. An electrical conductor is disposed in the aperture of the header member with an externally projecting portion of the conductor to which electrical leads are attached. An enlarged internally projecting portion of the conductor has a circumscribing coil spring compressed between it and the header member. An electrically and thermally conductive member is also disposed at the lower end of the cylindrical shell with a portion extending externally thereof.

A body of thermoelectric material or a plurality of bodies of thermoelectric material are disposed within the chamber formed by the cylindrical shell substantially filling the space therein. A particular alloy solder is disposed between each of the bodies of thermoelectric materials and between the bodies of thermoelectric materials and the electrical conductors so as to provide electrical contact therewith. The alloy solders are of such composition, that at the operating temperature of the element the solders are, at least in part, in the liquid state.

The bonding materials employed in the devices are chosen on their ability to wet the thermoelectric materials at the operating temperature of the device to insure good electrical contact therewith. The bonding materials may comprise pure metals or alloys, such as, 37% Bi 38% Pb 25% Sn, 96.5% Sn 3.5% Ag, 35% Ag 65% In, 50% In 50% Sn, 5% Ag 95% Pb, 95% In 5% Cu, 85% Sn 15% Cu, 90% Pb 10% Ag, 85% Zn 15% Ag, pure Pb, pure In or pure Sn or any other metals and alloys that meet the above requirements.

Referring to FIGURES 1 and 2 there is shown a thermoelectric element 10 comprising p-type thermoelectric materials and a thermoelectric element 12 comprising n-type thermoelectric materials, which together form a thermoelectric couple or generator. The elements 10 and 12 each comprise a substantially similar outer insulated cylindrical shell 14. Each shell preferably contains an inner peripheral ridge 28 at the lower end thereof. At the upper end of the shell is disposed an apertured header member 16 which may be composed of the same material as the shell. While the header 16 may be joined to the shells 10 and 12 by welding, preferably, as is illustrated, the inner surface of the header and the outer surface of the shell are threaded. An inverted T-shaped electrically and thermally conductive metal member 18 having an electrical lead cable 20 extending from the upper end thereof, is disposed in the aperture of the header 16, the diameter of the widest portion 24 of the conductor 18 conforming closely to the inner diameter of the shell 14. The conductor 18 may be composed of any good electrical and thermal conductive material such as copper, aluminum, silver or nickel or base alloys thereof. A coil spring 22 circumscribes the narrow diameter portion of the conductor 18, the spring being compressed between the upper inner surface of the header 16 and the wide diameter portion 24 of the conductor 18. A T-shaped electrical and thermal conductor 26 is disposed at the lower end of the shell 14, with a wide diameter portion 27 of the conductor conforming closely to the inner diameter of the shell 16 and abutting the inner ridge 28 of the shell 14, with a portion of the conductor projecting externally from the shell.

In FIGURE 1 several bodies 30, 32 and 34 of thermoelectric material are stacked in the chamber formed by the inner walls of the shell 14 and the surfaces of the conductors 18 and 26. Alloy solder preforms 36 and 37 are disposed between conductor 18 and thermoelectric material 34 and between thermoelectric material 34 and thermoelectric material 32, respectively. Similarly, alloy preforms 38 and 39 are disposed between thermoelectric materials 32 and 30 and between thermoelectric material 30 and conductor 26, respectively.

In FIGURE 2 several bodies 42 and 46 of thermoelectric materials of an n-type are disposed in chamber formed by the walls of the shell 14 and the surfaces of conductors 18 and 26. Alloy solder preform 40 is disposed between the conductor 18 and thermoelectric material 46 and an alloy preform 41 is disposed between thermoelectric material 42 and conductor 26. Similarly, an alloy solder preform 43 is disposed between thermoelectric materials 46 and 42.

The thermoelectric materials prior to assembly of the device may be coated on opposite surfaces with thin layers of diffusion barrier metals in order to prevent diffusion into the thermoelectric material proper of the alloy solder. This barrier layer metal may be applied by plasma jet spray, vapor deposition, dip coating, or the like.

A single p-type thermoelectric material and a single n-type thermoelectric material may be employed in each of the elements 10 and 12; however, this limits the range of operating temperatures and the efficiency of the device. When a plurality of bodies of thermoelectric material are employed, they are stacked in sequence according to the operating temperature of each individual thermoelectric material. For instance, if the hot junction in each of the elements is to be at conductors 26, the highest operating temperature thermoelectric material is disposed adjacent thereto while the lowest operating range thermoelectric material is situated the farthest from the hot junction or at the cold junction 24. The thermoelectric materials are selected on the basis of the range of operating temperatures desired in the device.

A common electrically and thermally conductive strap 48 is joined to the conductors 26 of each of the elements 10 and 12 to provide a thermoelectric couple.

The following example is illustrative of the teachings of the invention:

A pair of thermoelectric elements similar to those shown in FIGURES 1 and 2 were prepared. The cylindrical shell and the header members were composed of an aluminum silicate insulating material selling under the trade name Lavite and the conductor members were composed of oxygen free high conductivity copper. A thin disk of a 90% lead, 10% silver alloy is disposed on the lower electrical conductor of the cylindrical shell, the melting point of this bonding alloy being 566° C. The alloy will be subjected to operating temperatures in the range of from 600 to 650° C. A pellet of germanium bismuth telluride is then placed on the bonding alloy and is covered with a thin disk of a 96.5% tin, 3.5% silver bonding alloy which will be subjected to an operating temperature of 350° C. The tin alloy is followed by a pellet of zinc antimonide which is followed by a 50% indium 50% tin bonding alloy which will be subjected to an operating temperature of from 100° to 125° C. Finally, a pellet of bismuth antimony telluride is disposed on the indium tin alloy and is followed by another disk of the indium tin alloy. The header member containing the inverted T-shaped electrical conductor is secured to the cylindrical shell so that the spring coil circumscribing the electrical conductor exerts a pressure on the conductor of approximately 100 grams.

Similarly, an n-type element is prepared in the same manner by disposing on the electrical conductor at the lower end of the shell a 90% lead 10% silver alloy disk followed by a pellet of lead telluride, a disk of 50% indium 50% tin alloy, a pellet of bismuth telluride, and finally a disk of 50% indium 50% tin alloy.

The p and n-type elements are then bonded to a nickel strap using a copper silver tin bonding alloy having a melting point of 715° C. The joints are then made between the various thermoelectric pellets in alloy solder disks by firing in an argon furnace at a temperature of approximately 700° C.

The thermoelectric couple or generator was tested on a standard thermoelectric materials tester and the following results were obtained:

*Performance data*

| | |
|---|---|
| Load on each leg | 10 pounds. |
| Hot junction temperature | 578.9° C. |
| ΔT of couple | 566.5° C. |
| Open circuit E.M.F. | 196.0 mv. |
| At matched load: | |
| D.-C. voltage | 98.0 omv. |
| D.C. current | 17.25 amps. |
| Total input power | 47.50 watts. |
| Output power | 1.69 watts. |
| Couple resistance | $5.68\times10^{-3}$ ohms. |
| Average resistivity | $2.83\times10^{-3}$ ohm cm. |
| Case temperatures, ° C. | 68.3 at bottom; 91.0 at center; 51.8 at top. |

*Approximate values*

| | | |
|---|---|---|
| Case losses | watts | 23.0 |
| Couple heat input | watts | 24.5 |
| Efficiency, percent | | 6.9 |
| Thermal conductance K | watts/° C. | .035 |
| Average effective thermal conductivity K | watts/° C. cm. | .018 |

It should be understood that other pelletized thermoelectric materials may be employed in these thermoelectric devices since there is no limitations on the expansion characteristics of the thermoelectric materials or the bonding alloys. The operating temperature of the device described herein is above the melting points of the solders, therefore, the thermoelectric pellets may expand during operation without causing fracture or failure. Also, thermal conduction to the liquid joints are improved because of nonporosity since gas holes sometimes found in a solidified solder joint affect electrical and thermal conductivity.

While the invention has been described with reference to particular embodiments and examples, it will be understood, of course, that modifications, substitutions and the like may be made therein without departing from its scope.

We claim as our invention:

1. A thermoelectric element comprising an open ended insulated cylindrical container, electrically and thermally conductive means disposed at each end thereof, at least one body of thermoelectric material disposed in the container between the conductive means, and a layer of solder disposed between each of the bodies of thermoelectric materials and between the bodies of material and the conductive means, said solder consisting essentially of at least one element selected from the group consisting of lead, tin, indium and base alloys thereof, means forcing the conductive means together whereby to maintain good contact with the thermoelectric body, the solder at the operating temperature of the element being at least partially in the liquid state.

2. A thermoelectric element comprising an outer insulated cylindrical shell having a header member disposed on the upper end thereof, the header member having an electrical conductor passing therethrough, an electrically and thermally conductive member disposed at the lower end of the cylindrical shell, means forcing the conductors together whereby to maintain good contact with the thermoelectric body, a plurality of thermoelectric members of different composition disposed within the shell, a layer of solder disposed between each of the bodies of thermoelectric material and between the thermoelectric bodies and the conductors so as to provide electrical contact therewith, said solder consisting essentially of at least one element selected from the group consisting of lead, tin, indium and base alloys thereof, each of the solders being of a different composition and having different melting points so that at the operating temperature of each thermoelectric body the solders in immediate contact therewith are at least in part, in the liquid state.

References Cited by the Examiner

UNITED STATES PATENTS

| | | | |
|---|---|---|---|
| 2,887,283 | 3/1959 | Justi | 136—4.2 |
| 2,952,725 | 9/1960 | Evans | 136—4.2 |
| 2,976,340 | 3/1961 | Heinicke et al. | 136—4.2 |
| 3,051,767 | 8/1962 | Fredrick et al. | 136—4 X |

WINSTON A. DOUGLAS, *Primary Examiner.*

JOHN H. MACK, *Examiner.*

A. M. BEKELMAN, *Assistant Examiner.*